United States Patent [19]

Hopwood et al.

[11] 4,318,055
[45] Mar. 2, 1982

[54] DIGITALLY CONTROLLED PHASE LOCK DISTILLATOR SYSTEM

[75] Inventors: Francis W. Hopwood, Severna Park; John P. Muhlbaier, Joppa, both of Md.; Jeffrey T. Oakes, Morrisville, N.C.; James T. Haynes, Elicott City, Md.

[73] Assignee: Westinghouse Electric Corp., Pittsburgh, Pa.

[21] Appl. No.: 70,232

[22] Filed: Aug. 27, 1979

[51] Int. Cl.³ ............................................. H03L 7/16
[52] U.S. Cl. ...................................... 331/12; 331/16; 331/25
[58] Field of Search ..................... 331/1 A, 16, 17, 18, 331/25, 10, 11, 12

[56] References Cited

U.S. PATENT DOCUMENTS

| | | | |
|---|---|---|---|
| 4,099,137 | 7/1978 | Alm, Jr. et al. | 331/16 |
| 4,105,946 | 8/1978 | Ikeda | 331/10 X |
| 4,156,204 | 5/1979 | Hargis | 331/12 |

*Primary Examiner*—Siegfried H. Grimm
*Attorney, Agent, or Firm*—J. B. Hinson

[57] ABSTRACT

A system for comparing the frequency of a voltage controlled oscillator to a stable reference oscillator to generate control signals which maintain the voltage controlled oscillator in phase lock with the reference oscillator. The circuit utilizes a digital frequency comparator to determine whether the output frequency of the voltage controlled oscillator is above or below the reference frequency. When the frequency of the oscillator is either above or below the desired value, pulses are generated which are integrated to produce a DC signal which changes the frequency of the oscillator to achieve the desired value. Additionally, a continuous electrical signal is generated when the output of the voltage controlled oscillator is in phase with the reference signal. When phase lock is achieved the output of the frequency determining circuit goes to zero and phase lock is maintained by the continuous electrical signal.

6 Claims, 2 Drawing Figures

4,318,055

DIGITALLY CONTROLLED PHASE LOCK DISTILLATOR SYSTEM

GOVERNMENT CONTRACT

The U.S. Government has rights in this invention pursuant to Contract No. DAAK10-78-C-0057 awarded by Department of Defense.

BACKGROUND OF THE INVENTION

1. Field of the Invention:

The invention relates to oscillators and more specifically to a phase lock loop utilizing a digital frequency measuring circuit to generate a signal which adjusts the voltage controlled oscillator to the desired frequency and an analog phase lock loop to establish and maintain phase lock.

2. Description of the Prior Art:

In prior art phase lock loops the control signal for the voltage tuned oscillator has traditionally been generated either using all analog or all digital techniques. A typical example of a phase lock system using all digital techniques is disclosed in U.S. Pat. No. 4,099,137. This patent discloses a system in which the output signal of a voltage controlled oscillator is compared to a reference signal to generate control signals for incrementing an up/down counter. The up/down counter controls a random access memory to generate digital signals which are converted to an analog signal to control the voltage controlled oscillator to establish and maintain phase lock. A linear technique for maintaining phase and frequency lock is disclosed in a paper presented by Robert A. Cordell, Jan B. Forney, William N. Dunn and William G. Garrett at the ISSC Conference on Feb. 16, 1979. This technique measures both the frequency and phase of the voltage controlled oscillator to maintain them both locked to a control signal.

SUMMARY OF THE INVENTION

The preferred embodiment of the invention comprises a phase locked loop utilizing an oscillator whose frequency is varied by an electrical signal. A digital select signal is utilized to select the frequency of the variable frequency oscillator. If the frequency of the variable oscillator is above or below the desired value a signal is generated which is coupled to the variable oscillator to change its frequency to the desired value. An analog quadrature detector circuit is utilized to compare the phase of the output of the variable oscillator to the phase of the reference and generate a signal which is coupled to the variable oscillator to maintain the variable oscillator phase locked with the reference signal.

DESCRIPTION OF THE PREFERRED EMBODIMENT

Figure 1:
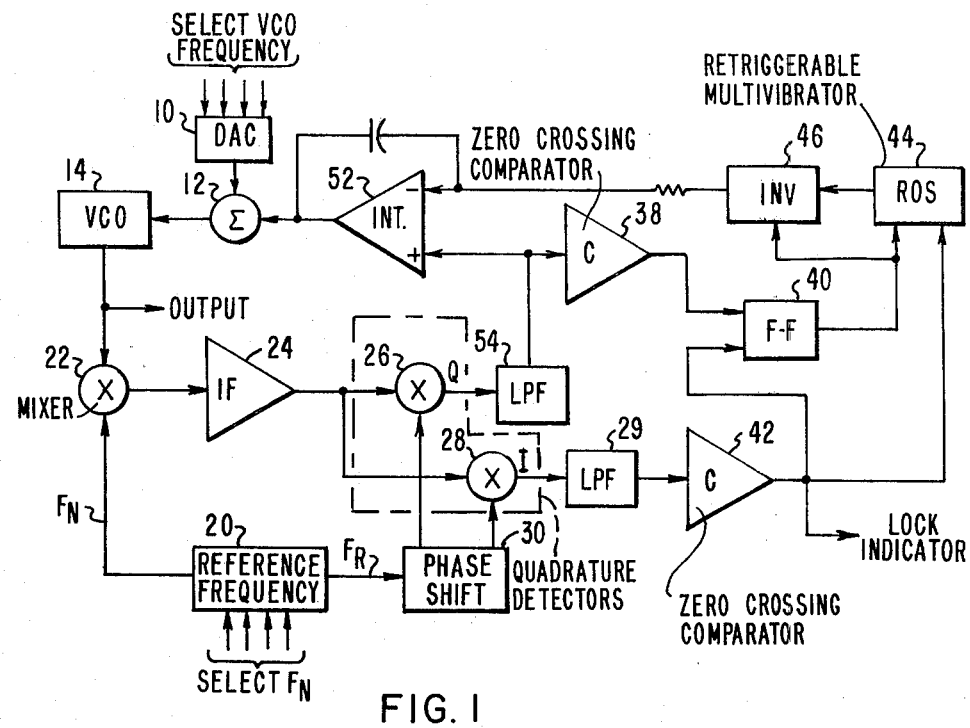
FIG. 1 is a block diagram of the preferred embodiment of the invention.

FIG. 1 is a block diagram of the preferred alog signal which is the primary control signal of the voltage controlled oscillator 14. The remainder of the circuitry generates a second analog frequency correction signal. These signals are coupled to the input terminals of a summer 12 to generate the control signal which maintains the frequency of the output signal of the voltage controlled oscillator 14 at the desired value. As is common with phase locked loops, a correction signal is needed because the VCO 14 tuning characteristics may not be perfectly linear and the VCO 14 may experience post tuning drift.

A stable reference frequency signal is provided by a reference signal generator 20. The reference frequency signal generator 20 has two outputs with the first being selected by a digital reference select signal and the second having a constant frequency. The first or selectable frequency output signal of the reference signal generator and the output signal of the voltage controlled oscillator are combined in a first mixer 22 to generate an IF signal which is equal to the difference between these two signals. The frequency of the IF signal is also equal to the frequency of the second output signal of the reference frequency generator under conditions of frequency and phase lock. The IF signal is amplified by an IF reference amplifier 24 to generate at the output of this amplifier an IF reference signal. This type of operation requires that VCO frequency select signal and the reference select signals be coordinated.

The IF signal is coupled to the first input of two identical quadrature detectors 26 and 28. The second output signal of the reference frequency source 20 is coupled to a phase shift network 30 to generate two signals which are substantially identical in amplitude and have a phase difference of 90°. These two signals are coupled to the second input of the quadrature detectors 26 and 28. The output signals of the quadrature detectors 26 and 28 depend on whether or not the IF signal and the second output signal of the reference source 20 are phase and frequency locked.

The output signals of the quadrature detectors 26 and 28 are distinctly different depending on the relative frequency and phase relationships between the IF frequency output signal from IF amplifier 24 and the output signal from the 90° phase shift network 30. There are four possible phase and frequency relationships between the IF signal and the output signals from the phase shift network 30: (1) the frequency of the IF signal is above the frequency of the reference signal; (2) the frequency of the IF signal is below the frequency of the reference signal; (3) the frequency of the IF signal and the frequency of the reference signal are the same, however, they are different in phase; and (4) the frequency of the IF signal and the frequency of the reference signal are the same and have the same phase.

The output signals of the quadrature detectors 26 and 28 are distinctly different for all of the possible above described relationships. The output signals of these detectors are utilized to generate a signal which maintains the output signal of the voltage controlled oscillator 14 phase and frequency locked with the second output signal of the reference generator 20.

Figure 2:
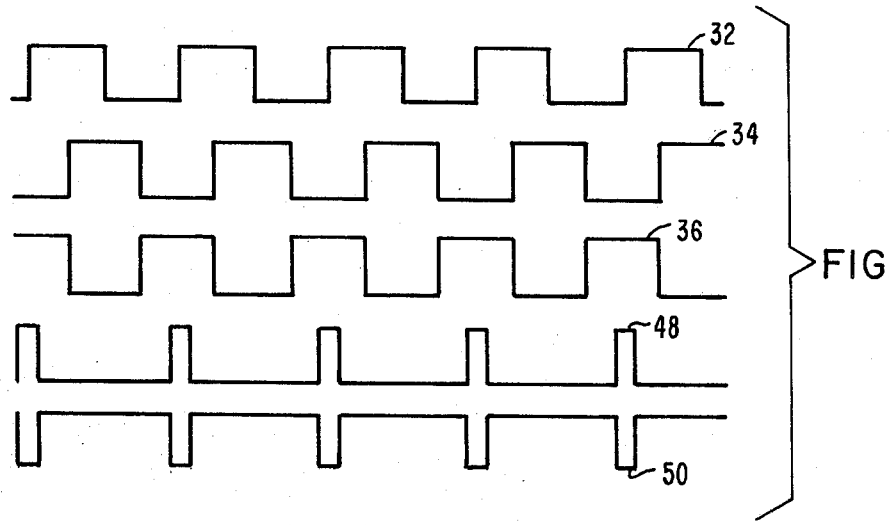
FIG. 2 is a waveform diagram illustrating the operation of the digital frequency detecting circuits.

When there is a frequency difference between the IF signal and the output signals of the phase shift network 30, the output of each of the quadrature detectors, 26 and 28, includes a signal having a frequency which is equal to the difference between the frequencies of the two input signals. The output signal of the second detector 28 is coupled to a first zero crossing comparator 42 through a low pass filter 29 to generate a square wave clock signal illustrated at reference numeral 32 in FIG. 2. Similarly the output of the first detector 26 is coupled to a second zero crossing comparator 38 through a second low pass filter 54 to generate a square wave data signal which will either lead or lag the clock signal 32 depending on the relative frequency relationship between the inputs to the detectors. For example, when the IF frequency is greater than the frequency of the output signals of the phase shift network 30, the data signal leads the clock signal 32 as illustrated at reference numeral 34 of FIG. 2. Similarly, when the output frequency of the IF signal is less than the frequency of the output signals of the phase shift network 30, the data signal lags the clock signal as illustrated at reference numeral 36. Since these two signals are dependent on a frequency difference between the output signal of the phase shift network 30 and the IF signal, they obviously disappear when these frequencies are identical.

The output of the first quadrature detector 26 is coupled to the input of a zero crossing comparator 38 through a low pass filter 54 to generate the data signal described above. This data signal is coupled to the input of a flip-flop 40. The output of the second detector 28 is similarly coupled to the input of a second zero crossing comparator 42 to generate the clock signal 32 which is coupled to the clock input of the flip-flop 40. This causes the state of the flip-flop 40 to change on every positive transition of the clock signal 32 provided the data signal is also high. The data signal will be either high or low on the positive transition of the clock signal 32 depending on the relative frequencies of the IF and output signals of the phase shift network 30, as described above.

The output signal of the flip-flop 40 and the clock signal to the flip-flop 40 are coupled as input signals to a retriggerable multivibrator 44 and an inverter circuit 46 to generate at the output of the inverter 46 a series of positive going pulses illustrated at reference numeral 48 whenever the frequency of the output signal of the voltage controlled oscillator 14 is greater than the frequency of the output signals of the phase shift network 30 and a series of negative going pulses 50 whenever the frequency of the output signal of the voltage controlled oscillator 14 is less thto produce a signal which is combined in the summer 12 with the output of the digital-to-analog converter 10 to produce the control signal to control the frequency of the voltage controlled oscillator 14. Since these pulses are dependent on a frequency error, they disappear when the frequency of the voltage controlled oscillator 14 has the desired value.

The output of the first quadrature detector 26 also switches to a substantially constant DC level when phase lock is achieved. This signal is coupled through a low pass filter 54 and also integrated by the integrator 52 and combined with the integrated value of the pulses described above to maintain phase lock once it has been achieved.

Since the pulse outputs of the inverter 46 are of constant width and have a frequency determined by the frequency difference between the output of the voltage controlled oscillator 14 and the reference source 20 the rate of frequency correction due to the integrated value of these pulses is proportional to the frequency error. This results in a very rapid correction of errors with the rate of correction being proportional to the error. This is essentially a decaying exponential correction function. Once the frequency error is reduced to zero the continuous output signal of quadrature detector 26 maintains phase lock between the voltage controlled oscillator 14 and the reference source 20. The above described phase locked loop can be implemented using commercially available components. Therefore, no details of these components are illustrated.

We claim:
1. A phase locked loop system for generating a signal having a selected frequency, comprising:
   (a) a frequency source for generating a reference signal;
   (b) means for generating a signal specifying the desired frequency of a voltage controlled oscillator;
   (c) an oscillator for generating an output signal whose frequency is determined by the amplitude of a control signal;
   (d) quadrature detector compare means for comparing the frequency of said output signal to the frequency of said reference signal to generate a difference signal indicating that the output frequency of said oscillator is not the desired value;
   (e) means responsive to said signal specifying the desired frequency of said voltage controlled oscillator and a signal corresponding to said difference signal to change the amplitude of said control signal to maintain the frequency of said output signal at the desired value.

2. A phase locked loop system in accordance with claim 1 wherein said difference signal comprises a pulsed electrical signal with said pulses having a first polarity whenever the frequency of said oscillator is above the frequency of said reference signal and a second polarity whenever the frequency of said oscillator is below the frequency of said reference.

3. A phase locked loop system in accordance with claim 2 wherein the pulses comprising said difference signal are integrated to produce a signal which is combined in a summing circuit to produce said control signal which changes the frequency of said oscillator to reduce the difference between the frequency of said oscillator and the desired frequency.

4. A phase locked loop in accordance with claim 1 wherein said difference signal is coupled to an input terminal of an analog integrator to produce said signal corresponding to said difference signal.

5. A phase locked loop in accordance with claim 4 wherein said signal corresponding to said difference signal and said signal specifying the frequency of said voltage controlled oscillator are combined in a summing circuit to generate said control signal.

6. A phase locked loop system comprising:
   (1) A voltage controlled oscillator circuit;
   (2) Circuit means for generating a signal indicative of the desired frequency of said voltage controlled oscillator;
   (3) A reference frequency source for generating first and second reference signals;
   (4) A first mixer circuit for combining the output signal of said voltage controlled oscillator with said first reference signal to generate an output signal having a frequency equal to the difference in frequency of these two signals;
   (5) Phase shift means responsive to said second reference signal for generating third and fourth reference signals having the same frequency as said second reference signal and separated in phase by approximately 90 degrees;
   (6) First and second circuits for combining said output signal of said first mixer with said third and fourth signals to generate fifth and sixth signals indicative of the frequency difference between the frequency of the output signal of said first mixer and said third and fourth reference signals;

(7) Means responsive to said fifth and sixth signals to generate a seventh signal indicative of the frequency difference between the output signal of said voltage controlled oscillator and said desired frequency of said voltage controlled oscillator;

(8) Means for combining said signal indicative of the desired frequency of said voltage controlled oscillator with said signal indicative of the difference in frequency between the output signal of said voltage controlled oscillator and said desired frequency of said voltage controlled oscillator to generate a signal which adjusts the frequency of said voltage controlled oscillator to the desired value.

* * * * *